(12) United States Patent
Kim

(10) Patent No.: US 6,528,404 B2
(45) Date of Patent: Mar. 4, 2003

(54) SEMICONDUCTOR DEVICE AND FABRICATION METHOD THEREOF

(75) Inventor: Jae-Hyung Kim, Cheongju (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 3 days.

(21) Appl. No.: 09/767,957

(22) Filed: Jan. 24, 2001

(65) Prior Publication Data

US 2001/0024856 A1 Sep. 27, 2001

(30) Foreign Application Priority Data

Jan. 25, 2000 (KR) ................................ 2000-3421

(51) Int. Cl.$^7$ ........................................ H01L 21/4763
(52) U.S. Cl. ................. 438/596; 438/592; 438/595; 438/618; 438/622
(58) Field of Search ................ 438/618, 622, 438/625, 636, 666, 652, 595, 596, 592, 635, 769, 770; 257/336, 344

(56) References Cited

U.S. PATENT DOCUMENTS

| | | | |
|---|---|---|---|
| 5,091,763 A | * 2/1992 | Sanchez | 257/344 |
| 5,097,301 A | * 3/1992 | Sanchez | 257/408 |
| 5,324,960 A | * 6/1994 | Pfiester et al. | 257/67 |
| 5,498,555 A | * 3/1996 | Lin | 438/302 |
| 5,686,329 A | * 11/1997 | Chang et al. | 438/253 |
| 5,796,151 A | * 8/1998 | Hau et al. | 257/410 |
| 6,043,545 A | * 3/2000 | Tseng et al. | 257/408 |
| 6,171,981 B1 | * 1/2001 | Byun | 438/785 |
| 6,306,743 B1 | * 10/2001 | Lee | 438/592 |

FOREIGN PATENT DOCUMENTS

JP  2000-101069 A  *  7/2000  ............ H01L/29/78

OTHER PUBLICATIONS

Hayashi et al. (JP 2000–101069A) (Translation).*

* cited by examiner

*Primary Examiner*—Amir Zarabian
*Assistant Examiner*—Maria Guerrero
(74) *Attorney, Agent, or Firm*—Birch, Stewart, Kolasch & Birch, LLP

(57) ABSTRACT

A semiconductor device and a fabrication method thereof that can improve performance and reliability by restricting the generation of a hot carrier effect is disclosed. Such a semiconductor device includes: a semiconductor substrate; a gate insulating layer formed on the semiconductor substrate; a-gate structure including a first gate electrode formed on the gate insulating layer and a second gate electrode formed on the first gate electrode; and conductive structures, e.g., sidewall spacers formed at the sides of the gate, electrically insulated from the first gate electrode, and electrically connected to the second gate electrode. Such a method for fabricating the semiconductor device includes: sequentially forming a gate insulating layer, a first gate electrode and a second gate electrode on a semiconductor substrate; re-oxidizing the gate insulating layer; and forming conductive spacers at the sides, respectively, of the first gate electrode and the second gate electrode.

11 Claims, 4 Drawing Sheets

SEMICONDUCTOR DEVICE AND FABRICATION METHOD THEREOF

BACKGROUND OF THE INVENTION

1. Field of the Invention

The present invention relates to a semiconductor device and a fabrication method thereof, and in particular to a metal oxide semiconductor field effect transistor (MOSFET) device which can improve performance and reliability by restricting generation of a hot carrier effect, and a fabrication method thereof.

2. Description of the Background Art

An operational effect of a semiconductor device is improved by increasing an integration degree thereof. As the integration degree is increased, the number of chips to be fabricated on a single wafer is also increased, and thus the unit cost of the chip is decreased. Accordingly, the integration degree of the semiconductor device is continuously increased, and thus a submicron semiconductor device can be fabricated.

However, while a size of the device is gradually reduced, a voltage supplied to the device is almost constantly maintained. As the integration degree of the device is increased, an electric field formed in the device becomes stronger, which results in a hot carrier effect.

An N-channel MOSFET device will now be discussed.

The hot carrier effect influences the device characteristics, as follows.

1) The electric field of a drain junction biased in a backward direction may cause impact ionization and carrier propagation. Here, a hole which is generated represents the substrate current. Some of the holes move to the source, reduces the source barrier and causes electron injection from the source to the p-type region. Actually, in case an n-p-n transistor operation is generated among the source-channel-drain, a gate may not be able to control the current.

2) Because of the strong electric field, the electrons may travel beyond an energy barrier existing at an interface between the semiconductor substrate and a gate insulating layer, and may be injected into the gate insulating layer. The injected electrons are trapped in the gate insulating layer and cause interface states. As a result, a threshold voltage and current-voltage characteristics of the device are varied. In addition, various other problems may occur.

In order to fabricate a semiconductor device having high performance and reliability by solving performance deterioration resulting from the hot carrier effect, various MOSFET device structures have been suggested. Here, a remarkable suggestion is a MOSFET device having a lightly doped drain (LDD) structure. The LDD structure reduces the size of a peak electric field generated at a depletion region of the MOSFET device, thereby restricting generation of the hot carrier effect. In addition, a lightly doped n− region is formed between a gate edge and a source/drain region (n+ region). Accordingly, a voltage drop generated in the device occurs in a wider region, as compared with a conventional MOSFET device.

However, the LDD structure has a disadvantage in that a weak overlap occurs and thus reduces an overlapped region between the gate and the drain. The influence of the gate is decreased at a region where the weak overlap takes place. As a result, when forming a channel by applying a voltage over a threshold voltage to the gate, a channel having a high resistance is formed at the region where the weak overlap takes place, as compared with a channel corresponding to a center portion of the gate.

In order to solve the weak overlap in the LDD structure, a fully overlapped LDD structure has been suggested. The fully overlapped LDD structure positions a peak electric field in the MOSFET device below the gate, which results in improved performance and reliability of the MOSFET device. Since the peak electric field is positioned below the gate, a voltage drop between the drain and the channel when a strong voltage is supplied to the gate is minimized, a horizontal electric field is decreased, and performance deterioration of the device when a localized charge increases a resistance of the drain is prevented. Furthermore, as compared with the conventional LDD structure, the doping density of the n− region can be lowered, and thus the horizontal electric field can be decreased.

The easiest method for implementing the fully overlapped LDD structure is to form a conductive spacer consisting of a polycrystalline silicon and the like at the sides of the gate. After the formation of the gate, the conductive spacer is formed at the sidewalls of the gate by forming the n− region by ion implantation and depositing and etching the polycrystalline silicon.

FIGS. 1(a) to 1(e) illustrate the sequential steps of the conventional method for fabricating the semiconductor device having the fully overlapped LDD structure using the conductive spacer.

As shown in FIG. 1(a), a gate insulating layer 3, a polycrystalline silicon layer 5 and a capping insulating layer 7 are sequentially formed and stacked on a semiconductor substrate 1.

Thereafter, as depicted in FIG. 1(b), a photoresist film pattern (not shown) is formed at a predetermined region of the capping insulating layer 7. A capping layer 17 and a gate electrode 15 are formed by employing the photoresist film pattern as a mask, and sequentially etching the capping insulating layer 7 and the polycrystalline silicon layer 5. The capping layer 17 and the gate electrode 15 compose a gate 20. Then, the photoresist film pattern (not shown) is removed.

As shown in FIG. 1(c), ions such as As and P are implanted into the semiconductor substrate 1 at the sides of the gate 20 by using the gate 20 as a mask. Accordingly, an n− region (not shown) is formed at both sides of the gate electrode 15.

As illustrated in FIG. 1(d), a conductive polycrystalline silicon layer 9 is deposited on the whole surface of the semiconductor device as shown in FIG. 1(c).

Thereafter, as depicted in FIG. 1(e), the polycrystalline silicon layer 9 is removed by anisotropic etching, except for the polycrystalline silicon layer 19 at the sides of the gate 20. Thus, a conductive spacer 19 is formed at the both sides of the gate 20. Ions such as As and P are implanted into the semiconductor substrate 1 at the side portions of the conductive spacer 19 by using the gate 20 and the conductive spacer 19 as a mask. Accordingly, an n+ region (not shown) is formed.

FIG. 2 is an enlarged view of part A in the conventional semiconductor device having the fully overlapped LDD structure using the conductive spacer as shown in FIG. 1(e). Part B in FIG. 2 shows the damaged gate insulating layer 3. That is, since an etching gas is concentrated on part B in the step for etching the gate electrode 15, the gate insulating layer 3 is overetched.

Because of the damaged gate insulating layer, when the voltage is applied to the gate 20, the electric field is concentrated on the damaged part of the gate insulating layer 3. As a result, the hot carrier effect may easily occur, and a breakdown voltage of the device may be decreased due to deterioration of the quality of the gate insulating layer 3.

Such disadvantages can be overcome by re-oxidizing the gate insulating layer 3 after removing the damaged part thereof. However, the re-oxidation step oxidizes the sides of the gate electrode 15 consisting of the polycrystalline silicon, in addition to the gate insulating layer. Therefore, an oxidation layer (not shown) is formed at the sides of the gate electrode 15, and thus the gate electrode 15 and the conductive spacer 19 are electrically insulated from one another. Consequently, it is impossible to implement the fully overlapped LDD structure.

SUMMARY OF THE INVENTION

It is an object of the present invention to provide a semiconductor device which can improve performance and reliability by preventing a breakdown voltage from being reduced due to a damaged part of a gate insulating layer. This is accomplished by removing the damaged part of the gate insulating layer and re-oxidizing the gate insulating layer without electrically isolating the gate electrode from the sidewall conductive spacer, thereby restricting generation of a hot carrier effect while also implementing a fully overlapped LDD structure.

The present invention, in part, provides a semiconductor device including: a semiconductor substrate; a gate insulating layer formed on the semiconductor substrate; a gate structure including a first gate electrode formed on the gate insulating layer and a second gate electrode formed on the first gate electrode; and conductive structures, e.g., sidewall spacers formed at the sides of the gate, electrically insulated from the first gate electrode, and electrically connected to the second gate electrode.

The invention also, in part, provides a method for fabricating a semiconductor device including: sequentially forming a gate insulating layer, a first gate electrode and a second gate electrode on a semiconductor substrate; for re-oxidizing the gate insulating layer; and forming conductive spacers at the sides, respectively, of the first gate electrode and the second gate electrode.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A structure of a semiconductor device and a fabrication method thereof in accordance with preferred embodiments of the present invention will now be described in detail with reference to the accompanying drawings.

Figure 3:
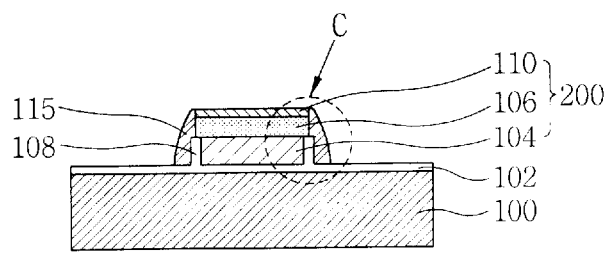
FIG. 3 is a cross-sectional view illustrating a semiconductor device in accordance with a preferred embodiment of the present invention.

FIG. 3 illustrates the structure of the semiconductor device in accordance with a first embodiment of the present invention. A gate insulating layer 102 which can include silicon oxide such as $SiO_2$ is formed on a semiconductor substrate 100. The semiconductor substrate 100 can include single crystalline silicon. A silicon on insulator (SOI) structure where a silicon layer is formed on an insulating substance substrate such as sapphire and silicon oxide may be used as the semiconductor substrate.

A first gate electrode 104, a second gate electrode 106 and a capping layer 110 are sequentially stacked and formed at a predetermined region of the upper surface of the gate insulating layer 102. The first gate electrode 104 can be polycrystalline silicon or alternatively amorphous silicon. The second gate electrode 106 can be a material having conductivity and oxidation resistance, especially a metal or metallic compound. In the present embodiment, the second gate electrode 106 includes tungsten. A silicide layer 105 (shown by dashed lines in FIG. 4 to emphasize that is an optional structure) may be formed between the first gate electrode 104 and the second gate electrode 106. The capping layer 110 can be an insulating material. Here, the capping layer 110 includes a silicon nitride, such as $Si_3N_4$. The first gate electrode 104, the silicide layer 105 (optionally), the second gate electrode 106 and the capping layer 110 define a gate 200.

A side insulating layer 108 is formed at both sides of the first gate electrode 104. The side insulating layer 108 can be an insulating material, especially a silicon oxide such as $SiO_2$. A conductive spacer 115 is formed at the sides of the side insulating layer 108, the second gate electrode 106 and the capping layer 110. The conductive spacer 115 can be a conductive material such as a polycrystalline silicon, and is insulated from the first gate electrode 104 by the side insulating layer 108 and electrically connected to the second gate electrode 106.

Figure 1A:
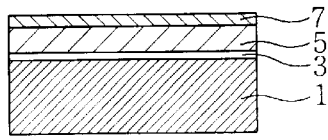
FIGS. 1(*a*) to 1(*e*) illustrate the sequential steps of a conventional method for fabricating a semiconductor device.
Figure 1B:
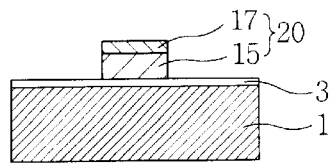
Figure 1C:
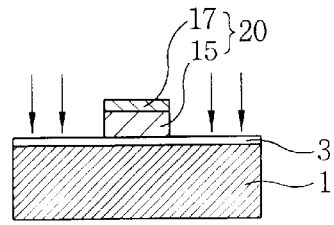
Figure 1D:
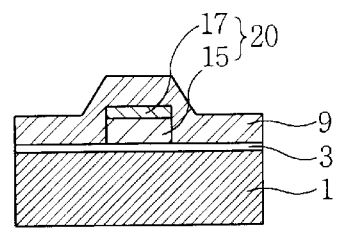
Figure 1E:
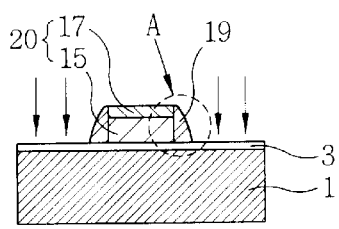
Figure 2:
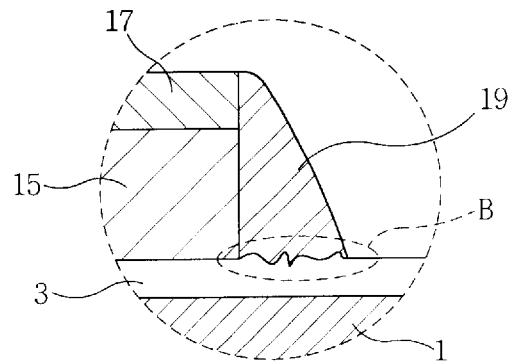
FIG. 2 is an enlarged cross-sectional view illustrating part A of the semiconductor device as shown in FIG. 1(*e*)
Figure 4:
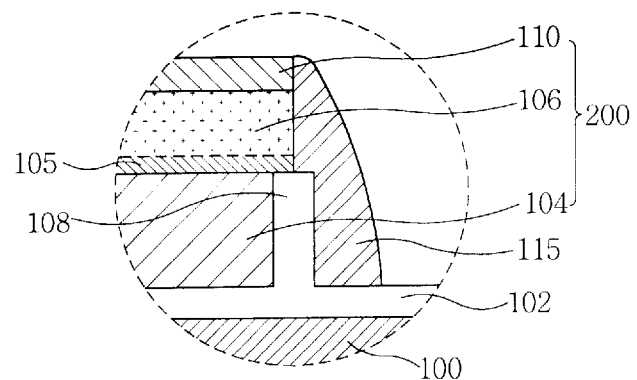
FIG. 4 is an enlarged cross-sectional view illustrating part C of the semiconductor device as shown in FIG. 3.

FIG. 4 is an enlarged cross-sectional view illustrating part C of the semiconductor device as shown in FIG. 3. As compared with the conventional semiconductor device as shown in FIG. 2, the gate insulating layer 102 wholly has a flat surface and does not have a damaged part.

Figure 5:
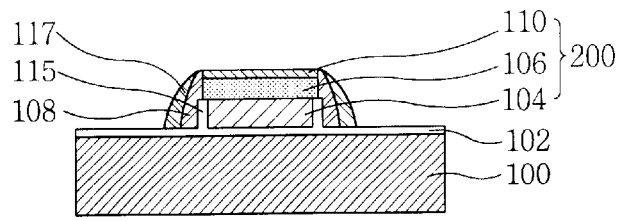
FIG. 5 is a cross-sectional view illustrating a semiconductor device in accordance with another embodiment of the present invention.

FIG. 5 illustrates another embodiment of a semiconductor device according to the present invention wherein an insulating spacer 117 is formed at the sides of the conductive spacer 115, as compared with the semiconductor device as shown in FIG. 3. The insulating spacer 117 is used to perform a succeeding self align process.

FIGS. 6(*a*) to 6(*f*) illustrate the sequential steps of the method for fabricating the semiconductor device in accordance with the first embodiment of the present invention.

As illustrated in FIG. 6(*a*), the gate insulating layer 102, a polycrystalline silicon layer 154, a tungsten layer 156 and a capping insulating layer 160 are sequentially stacked and formed on the first conductive type semiconductor substrate 100.

Figure 6A:
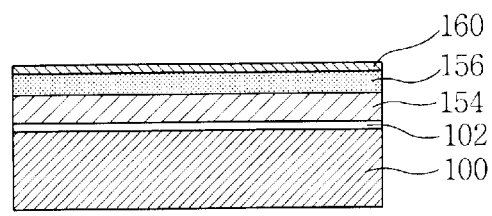
FIGS. 6(*a*) to 6(*f*) illustrate the sequential steps of a method for fabricating a semiconductor device in accordance with the embodiments of the present invention.
Figure 6B:
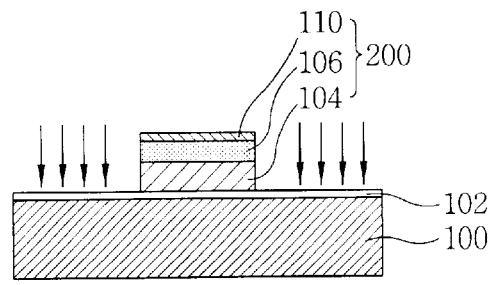

Thereafter, as shown in FIG. 6(b), a photoresist film pattern (not shown) is formed at a predetermined region of the capping insulating layer 160. The capping insulating layer 160, the tungsten layer 156 and the polycrystalline silicon layer 154 are sequentially etched by using the photoresist film pattern as a mask. As a result, the gate insulating layer 102, the first gate electrode 104, the second gate electrode 106 and the capping layer 110 are sequentially stacked and formed on the semiconductor substrate 100. After removing the photoresist film pattern (not shown), a second conductive type first lightly doped region (not shown) is formed by utilizing the gate 200 as a mask, and by implanting impurities into the first conductive type semiconductor substrate 100 at the sides of the gate 200.

Figure 6C:
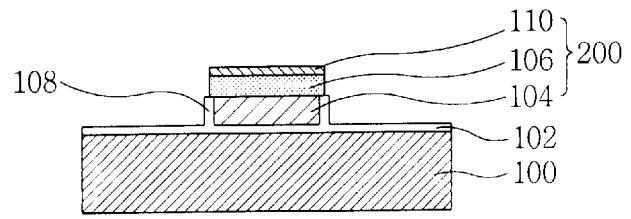

The gate insulating layer 102, damaged during the step for forming the first gate electrode 104, is cleansed and the damaged portion is removed. The removal process also etches the polycrystalline silicon layer 154. A re-oxidation process is performed on the layers 154 and 102. As illustrated in FIG. 6(c), the damaged part of the gate insulating layer 102 is restored, and the polycrystalline silicon in the first gate electrode 104 is oxidized, thereby forming a sidewall insulating layer 108 at the sides of the first gate electrode 104. Here, since the second gate electrode 106 can be a material having a superior oxidation resistance (again, e.g., tungsten), the insulating layer is not formed at the sides thereof.

Figure 6D:
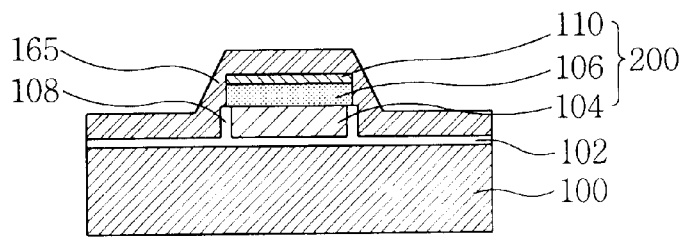

As depicted in FIG. 6(d), a polycrystalline silicon layer 165 is deposited on the whole surface of the semiconductor device as shown in FIG. 6(c).

Figure 6E:
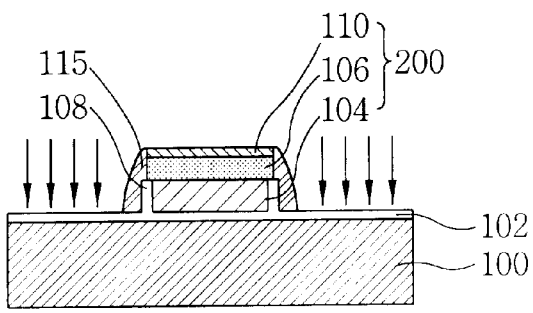

Thereafter, as illustrated in FIG. 6(e), a conductive spacer 115 is formed at the sides of the gate 200 and the sidewall insulating layer 108 by performing an anisotropic etching on the polycrystalline silicon layer 165. A second conductive type second heavily doped region (not shown) is formed by employing the conductive spacer 115 and the gate 200 as a mask, and by implanting impurities into the first conductive type semiconductor substrate 100 at the sides of the conductive sidewall spacer 115. The steps depicted in FIG. 6(E) result in the embodiment depicted in FIG. 3.

Figure 6F:
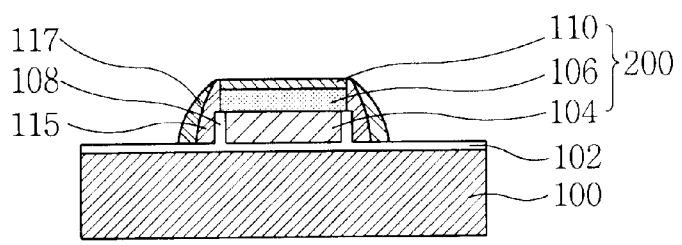

Optional steps are illustrated in FIG. 6(f). There, the insulating spacer 117 is formed at the sides of the conductive spacer 115 by forming an insulating layer on the whole surface of the semiconductor device as shown in FIG. 6(e), and performing anisotropic etching thereon. The steps depicted in FIG. 6(c) result in the embodiment depicted in FIG. 4.

The conductive spacer 115 and the insulating spacer 117 may be formed by stacking and depositing the polycrystalline silicon layer and the insulating layer on the whole surface of the semiconductor device as shown in FIG. 3(c), and by carrying out the anisotropic etching on the polycrystalline silicon layer and the insulating layer at the same time.

In accordance with the semiconductor device of the present invention, the gate insulating layer damaged by the re-oxidation process can be restored and yet the conductive spacer formed at the sidewalls of the gate and the gate electrode can be electrically connected by forming the second gate electrode of a high oxidation resistance on the first gate electrode.

As a result, the electric field that is concentrated on what otherwise would be the damaged part of the gate insulating layer, when applying a voltage to the gate, is concentrated on a repaired insulating layer. Accordingly, the present invention overcomes the disadvantages resulting from the damaged gate insulating layer, namely, the hot carrier effect is not easily generated and the breakdown voltage of the device is not reduced, because deterioration of the gate insulating layer is repaired.

In addition, since the fully overlapped LDD structure is embodied by electrically connecting the gate electrode to the conductive spacer, the present invention overcomes the disadvantages of the conventional semiconductor device of the LDD structure (namely, a channel having a high resistance is formed at a weak overlapped part between the gate and the source/drain region, when forming the channel by applying a voltage over a threshold voltage to the gate, as compared with a channel corresponding to a center part of the gate). Furthermore, the hot carrier effect is prevented.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a semiconductor device, comprising:

forming a gate insulating layer on a semiconductor substrate;

forming a first gate electrode on the gate insulating layer;

forming a second gate electrode on the first gate electrode;

re-oxidizing the gate insulating layer; and forming conductive spacers at the sides, respectively, of the first gate electrode and the second gate electrode, said conductive spacers being electrically insulated from the first gate electrode, and electrically connected to the second gate electrode.

2. The method according to claim 1, wherein the sides of the first gate are oxidized while the gate insulating layer is re-oxidized, resulting in the formation of side insulating layers against sides of the first gate electrode, respectively.

3. The method according to claim 1, further comprising forming a capping layer on the second gate electrode.

4. The method according to claim 1, wherein a damaged part of the gate insulating layer is removed before the gate insulating layer is re-oxidized.

5. The method according to claim 1, wherein the substrate is of a first conductivity type, the method further comprising:

forming a second conductive type first lightly doped region on the first conductivity type semiconductor substrate at the sides of the first gate electrode; and forming a second conductive type second heavily doped region on the first conductivity type semiconductor substrate at the sides of the conductive spacer.

6. The method according to claim 1, further comprising forming a silicide layer between the first and second gate electrodes.

7. The method according to claim 1, further comprising a step for forming an insulating spacer at the sides of the conductive spacer.

8. The method for fabricating a semiconductor device according to claim 1, wherein the second gate electrode comprises an oxidation resistant material.

9. The method according to claim 7, wherein the conductive spacer and the insulating spacer are formed by stacking a conductive layer and an insulating layer, and performing an anisotropic etching thereon.

10. The method for fabricating a semiconductor device according to claim 8, wherein the material having the oxidation resistance is a metal or metallic compound.

11. The method for fabricating a semiconductor device according to claim 10, wherein the second gate electrode is tungsten.

* * * * *